United States Patent
Wang et al.

(10) Patent No.: US 6,576,487 B1
(45) Date of Patent: Jun. 10, 2003

(54) METHOD TO DISTINGUISH AN STI OUTER EDGE CURRENT COMPONENT WITH AN STI NORMAL CURRENT COMPONENT

(75) Inventors: Zhigang Wang, San Jose, CA (US); Harpreet Kaur Sachar, Sunnyvale, CA (US); Kuo-Tung Chang, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/126,363

(22) Filed: Apr. 19, 2002

(51) Int. Cl.$^7$ .............................................. G01R 31/26
(52) U.S. Cl. ........................... 438/17; 438/14; 438/424
(58) Field of Search ............................ 438/14, 17, 424

(56) References Cited

U.S. PATENT DOCUMENTS

| | | | |
|---|---|---|---|
| 4,800,415 A | 1/1989 | Simmons et al. | |
| 5,576,223 A | 11/1996 | Zeininger et al. | |
| 6,037,607 A | 3/2000 | Hause et al. | |
| 6,130,122 A | 10/2000 | Johnson | |
| 6,232,193 B1 | 5/2001 | Chen et al. | |
| 6,297,128 B1 | 10/2001 | Kim et al. | |
| 6,298,470 B1 | 10/2001 | Breiner et al. | |
| 2003/0003681 A1 * | 1/2003 | Xu et al. | |

OTHER PUBLICATIONS

"Isolation Structures in Submicro CMOS", Silicon Processing for the VLSI Era—vol. 111, Wolf, pp. 367–373. Copyright 1995.

"Trench Warfare: CMP and Shallow Trench Isolation", Jim Schlueter, Speed Fam–IPEC Inc. Chandler, Arizona, reprinted from the Internet at: http://www.semipark.co.kr/upload1/Trench%20Warfare.pdf.

"Filling and Slotting: Analysis and Algorithms*", Andrew B. Kahng, Gabriel Robins, Anish Singh, Huijuan Wang and Alexander Zelikovsky, reprinted from the Internet at: http://www.cs.virginia.edu/~robins/papers/date98_camera17_final.pdf.

* cited by examiner

Primary Examiner—Long Pham
(74) Attorney, Agent, or Firm—Eschweiler & Associates, LLC

(57) ABSTRACT

The present invention details a method which characterizes an STI fabrication process, and more particularly provides information relating to a variation in the STI sidewall profile between trenches in a middle portion of an array and a trench on an outer portion thereof. The method comprises forming two STI arrays with an STI fabrication process, forming a conductive layer over each array, biasing each conductive layer and determining a current associated therewith. The two current are then utilized to ascertain the variation of interest.

12 Claims, 10 Drawing Sheets

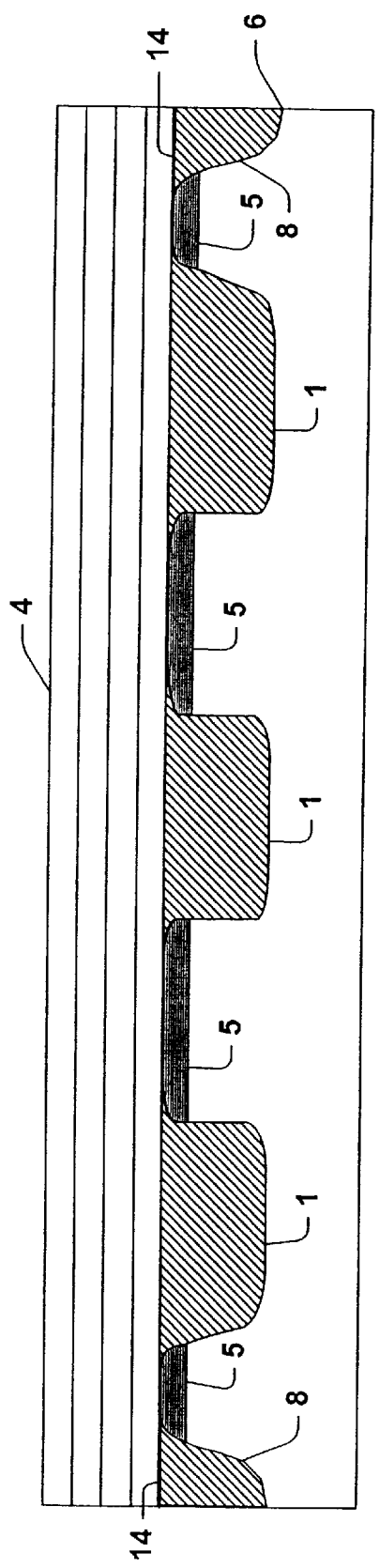
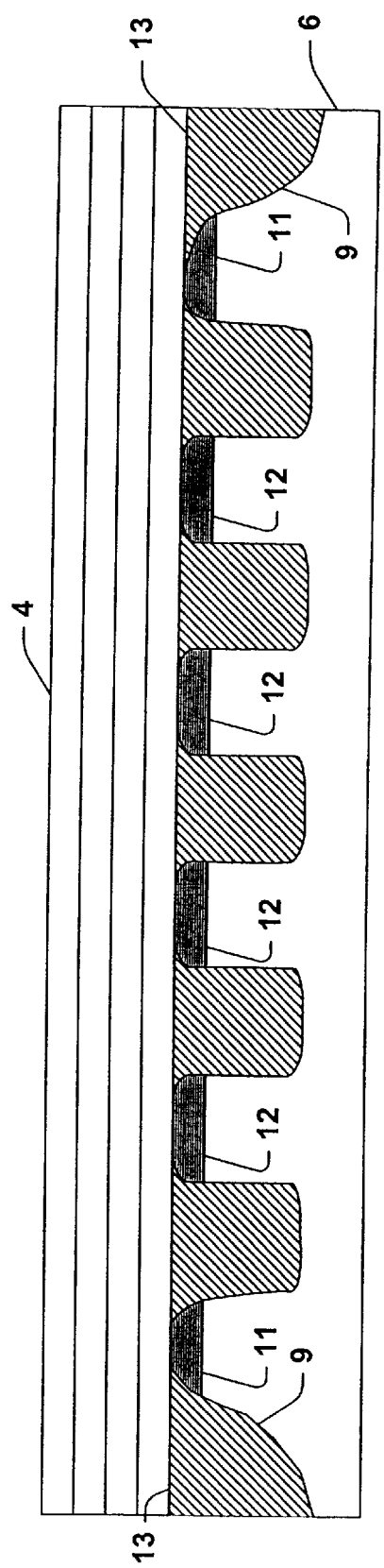
FIG. 5A
FIG. 5B

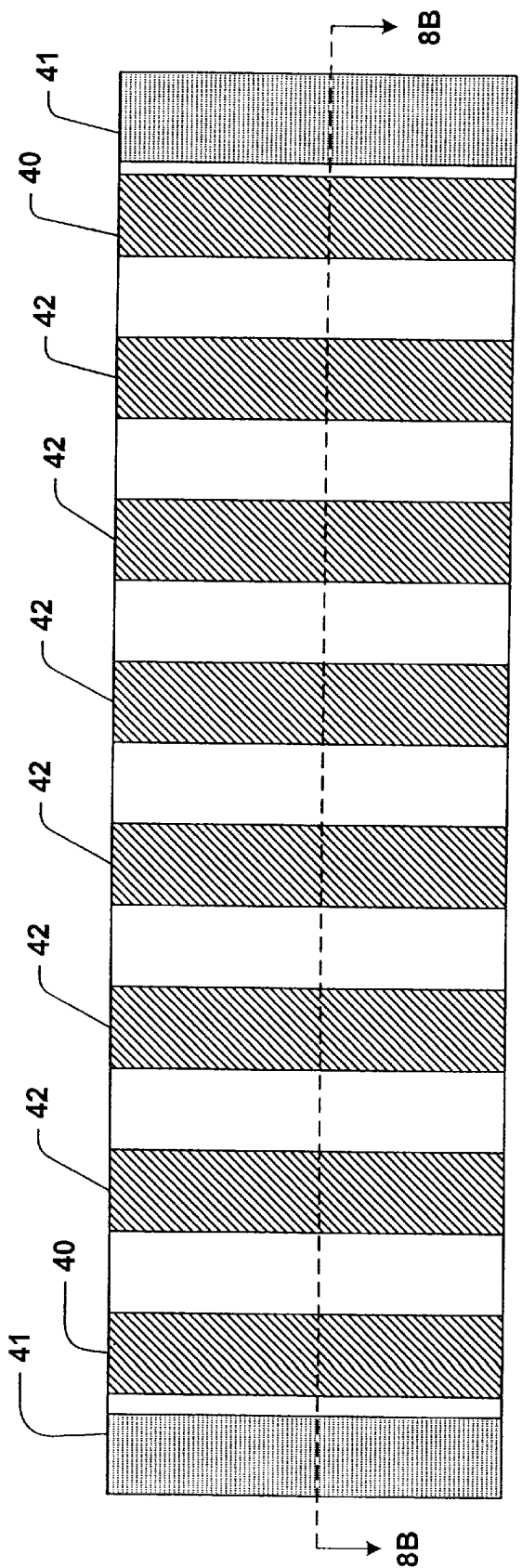
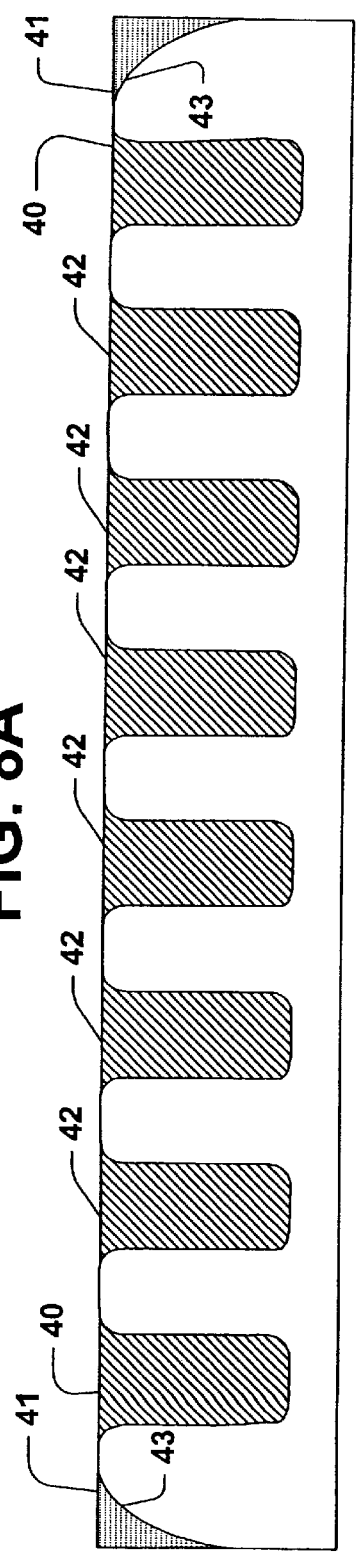
FIG. 8A
FIG. 8B

METHOD TO DISTINGUISH AN STI OUTER EDGE CURRENT COMPONENT WITH AN STI NORMAL CURRENT COMPONENT

TECHNICAL FIELD OF INVENTION

The present invention relates to the characterization of shallow trench isolation structures. In particular, the invention provides a method which can distinguish between an outer edge current component and a normal current component associated with an array of shallow trench isolation structures.

BACKGROUND OF THE INVENTION

Shallow trench isolation (STI) has become a common isolation method for deep submicron CMOS technologies and for some power devices. The shallow trench isolation process begins with a relatively shallow trench, which is first etched in a silicon (Si) substrate. This trench is refilled with an insulator material and the surface is planarized to complete the isolation structure. During fabrication, the shape of both the top and bottom corners of the trench are important for device performance. Sharp corners with a small bending radius or with faceting can cause high electric fields, high mechanical stress, and non uniform oxide thickness, resulting in a degradation of device performance and gate oxide integrity problems.

In addition, the etching process can result in shallow trench isolation regions within an array having different geometric shapes, in particular, the sidewalls of the trenches can be different. For instance, an adjacent trench formation or etching process, can influence the manner in which a given trench forms. This is especially true for STI regions located at the ends, or edges, of an array of STI regions and will be explained in detail later.

Prior art focused on trench corner characterization and developing process controls which are intended to minimize extreme bends in the shape of both the top and bottom corners of a trench. Models of trench shape and formation using experimental and numerical methods are available; concentrating on detection of sharp corners, extreme bends in trench sidewalls, and defects in the refill process. In addition, prior art modeled the shape of the trenches and the thickness of the oxide as accurately as possible. However, the prior art does not characterize differences between the shape of shallow trench isolation regions located on the edge of an STI array versus STI regions located in the center of an array. Prior art considered this issue as negligible, however as the industry proceeds with downward scaling of electronic devices, these differences need to be taken into account and characterized. This becomes apparent when considering the surface area of a transistor gate located adjacent to an STI region, where the STI region is located on an edge of an STI, and comparing it to the surface area of a transistor gate where the STI region is located within the center of such an array.

SUMMARY OF THE INVENTION

The following presents a simplified summary of the invention in order to provide a basic understanding of some aspects of the invention. This summary is not an extensive overview of the invention. It is intended to neither identify key or critical elements of the invention, nor delineate the scope of the invention. Its primary purpose is to present some concepts of the invention in a simplified form as a prelude to the more detailed description that is presented later.

The present invention details an approach in which the properties of an STI array can be easily characterized, including differences between the edge regions and the isolation regions located in the center of an STI array. This approach takes advantage of an intrinsic current enhancement inherent from the STI regions located on the outer edges of an STI array. A numerical method is then employed, which can distinguish two current components and thus provides vital characteristics of the STI sidewall structure. This approach allows for easy identification of the different characteristics for an STI array.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 5A & 5B are cross sectional views of prior art flash memory devices which compares variations in the shape of STI edge regions and the effects of down scaling the STI array.

FIGS. 8A & 8B are top and sectional views, respectively, of an STI array.

DETAILED DESCRIPTION OF THE INVENTION

The present invention will now be described with respect to the accompanying drawings, in which like numbered elements represent like parts. In order to facilitate an understanding of various advantageous features of the present invention, a brief discussion of the prior art will be provided. Subsequently, the various features of the present invention will be discussed in detail in conjunction with several exemplary figures.

Figure 1:
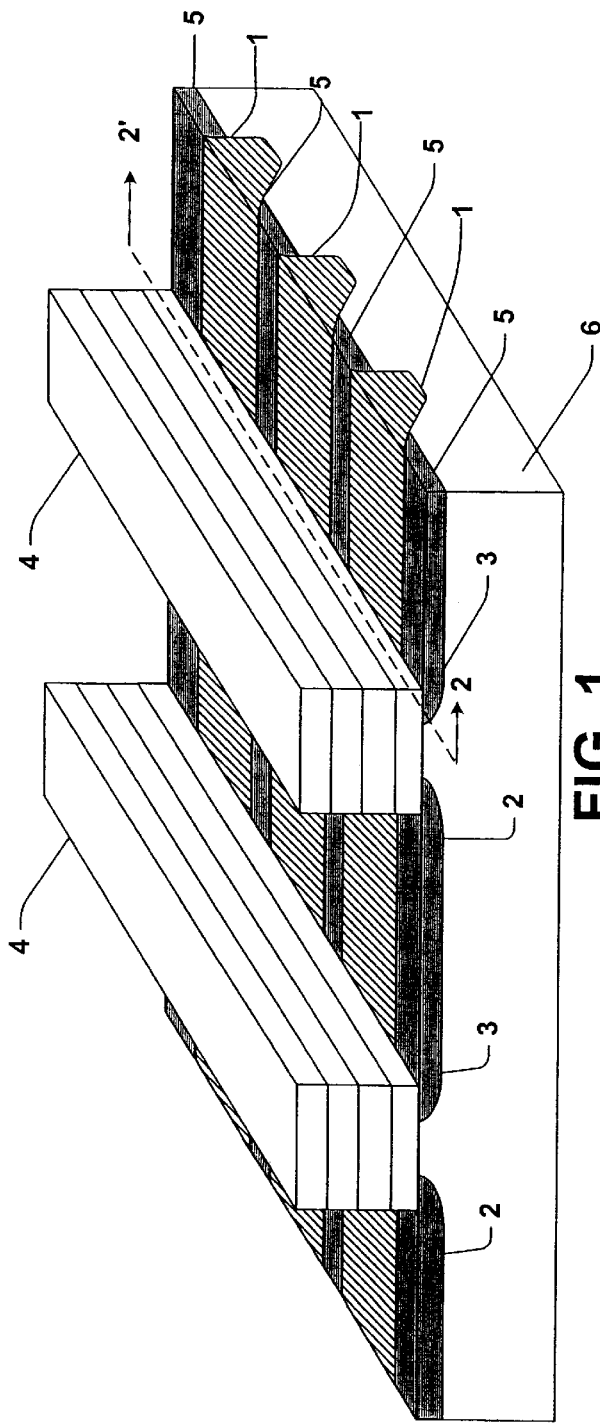
FIG. 1 is a perspective view of an exemplary prior art flash memory device in which shallow trench isolators are utilized to electronically isolate source and drain regions, respectively, of memory cells along a word line thereof.

As can be seen in FIG. 1, an exemplary, simplified flash memory device comprises several transistors or stacked gate cells, separated by trench isolation regions 1. Each cell comprises a drain 2, a source 3 and a stacked gate 4. The drain 2 and source 3 of each cell typically comprise an N-type material embedded in a P-type substrate 6. The stacked gate 4 may include several layers (or stacks) of oxides and conductive materials. Typically the memory cells are arranged, for example, as shown in FIG. 1, with an insulating trench, or STI region 1, electrically separating groups (or banks) of cells 5 along a word line.

Figure 2:
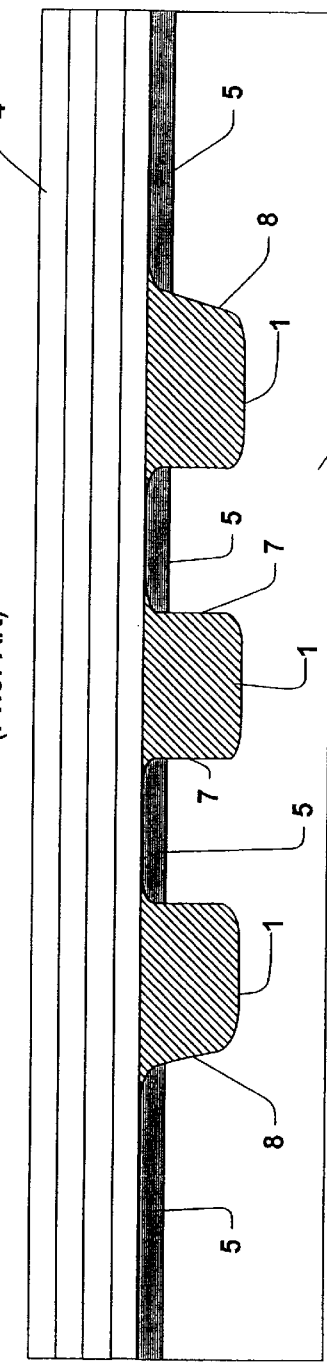
FIG. 2 is a cross sectional view of the prior art flash memory device of FIG. 1 taken along line 2–2'.

FIG. 2 provides an exemplary cross sectional illustration of the flash memory device of FIG. 1 taken along line 2–2'. From FIG. 2 it is clear that trench isolation regions 1 can be formed in a relatively consistent manner, when devices and regions are not scaled down and therefore the group of memory cells 5 performance is likewise consistent. In other words, the side wall shape of the outer trenches 8, is generally similar to that of the inner trench 7, because the shallow trench isolators have relatively large distances between them, thus minimizing their influence on an adjacent STI etching process.

As flash memory devices are scaled down, or include more devices, device isolation techniques have to be modified. Shallow trench isolation (STI) has become a common isolation method for deep submicron CMOS technologies. The shallow trench isolation process begins with a relatively shallow trench, which is first etched in a silicon (Si) substrate. This trench is refilled with an insulator material and the surface is planarized to complete the isolation structure. During fabrication, the shape of both the top and bottom corners of the trench become important for device performance. Sharp corners with a small bending radius, or with faceting, can cause high electric fields, high mechanical stress and non uniform oxide thickness, resulting in a degradation of device performance and gate oxide integrity problems. In addition, the etching processes can result in shallow trench isolators with different geometric shapes, in particular, the sidewalls of the trenches can be different. This occurs during the formation or etching process of the array of respective trenches. An adjacent trench formation, or etching, process can influence the manner in which a given trench forms. This is especially true for STI regions located at the ends or edges of an array of such regions and is illustrated, for example, in FIGS. 3 and 4.

Figure 3:
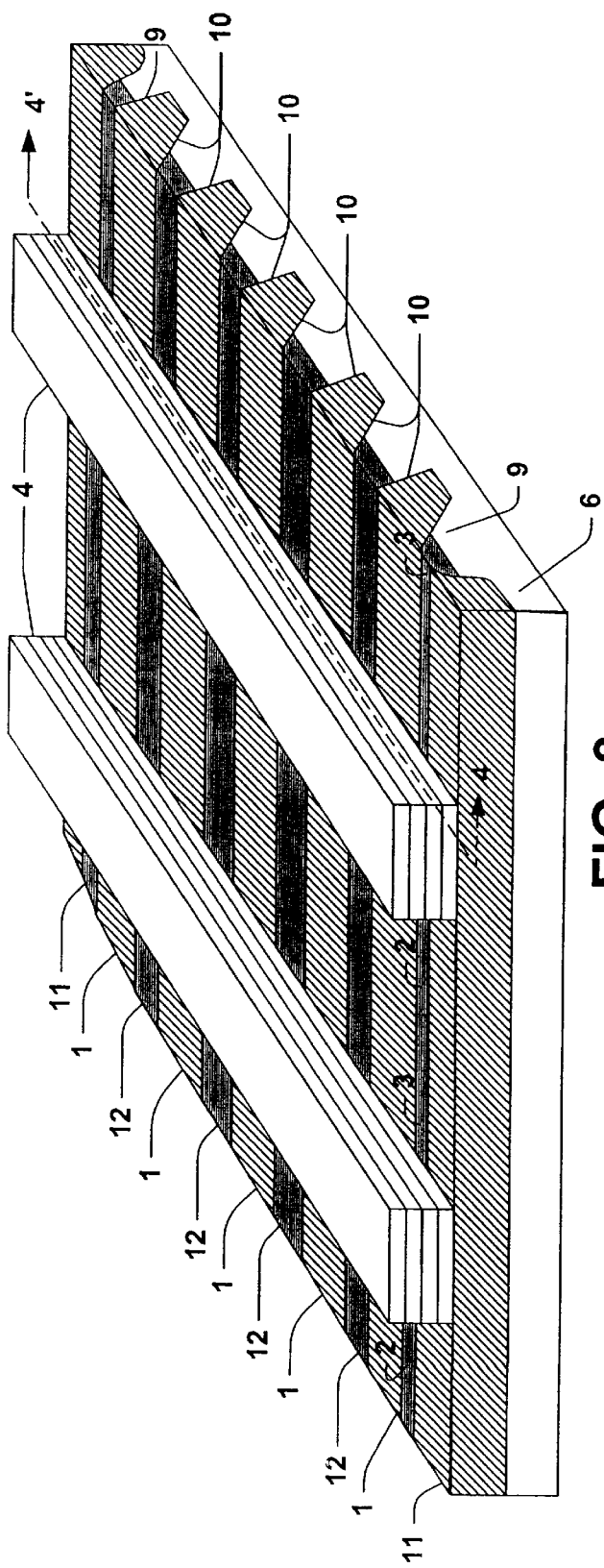
FIG. 3 is a perspective view of an exemplary flash memory device in which the effects of down scaling STI regions is illustrated.

FIG. 3 illustrates an exemplary flash memory device that has been scaled down or includes more devices. This scaled down flash memory device comprises several memory cells arranged in a manner similar to that of FIG. 1, separated by shallow trench isolation regions. Each memory cell comprises a drain 2, a source 3 and a stacked gate 4. The drain 2 and source 3 of each memory typically comprises an N-type material embedded in a substrate 6. The gate 4 may include several layers (or stacks) of oxides and/or conductors such as polysilicon. The memory cells are arranged, as shown in FIG. 3, with an insulating trench, or shallow trench isolation region, electrically separating memory cells 11, 12 along a word line. As the STI regions 10 decrease in size, variations in the side portions thereof on those regions on the outside of the array have a larger influence on the operation of memory cells associated therewith. Note that such variations in STI trench profiles in FIG. 3 and other figures are not necessarily drawn to scale, but rather are illustrated as such for purposes of clarity.

Figure 4:
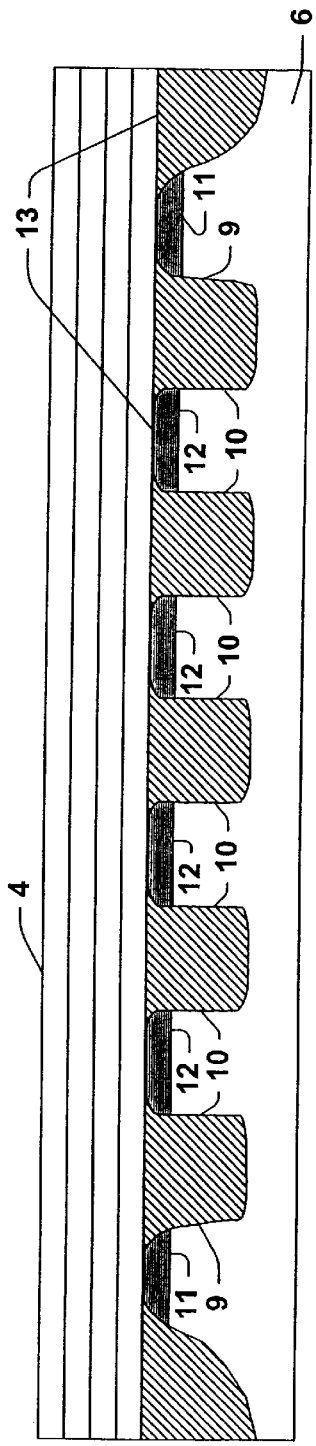
FIG. 4 is a cross sectional view of a flash memory device of FIG. 3 taken along line 3–3' in which the variations in STI regions is illustrated.

FIG. 4 provides an exemplary cross sectional illustration of the flash memory device of FIG. 3 taken along 3–3'. As clearly seen in FIG. 4, the shallow trench isolation regions 10 located on the edges of the array, have a different sidewall shape 9 than the sidewalls associated with the shallow trench isolation regions located within the center of the STI array due to micro-loading in the formation thereof. This difference can cause the memory cells 11 associated with the ends of the STI array to behave differently than the memory cells 12 located in the center of the STI array. This is especially true if the surface areas 13 of source/drain regions of the edge memory cells 11 are not equal or similar to the source/drain regions of memory cells 11 in the center of the array (e.g., different surface areas 13 can lead to different memory cell injection currents causing non-uniformities in the programming and erasing of memory cells across the memory cell array).

FIG. 5A provides a cross sectional illustration of the prior art device of FIG. 1 while FIG. 5B provides a cross sectional illustration of the device of FIG. 3. These figures are presented in order to emphasize the trench shape differences 8, 9 which can occur as memory cell density is increased. As can be seen, the source/drain areas 14 of the outside memory cell requires a certain degree of process control. However, as more memory cells are added to a device and STI regions become smaller, this surface area 13 becomes more difficult to control; therefore the process controls must become more stringent, including identification of key process parameters.

Figure 6:
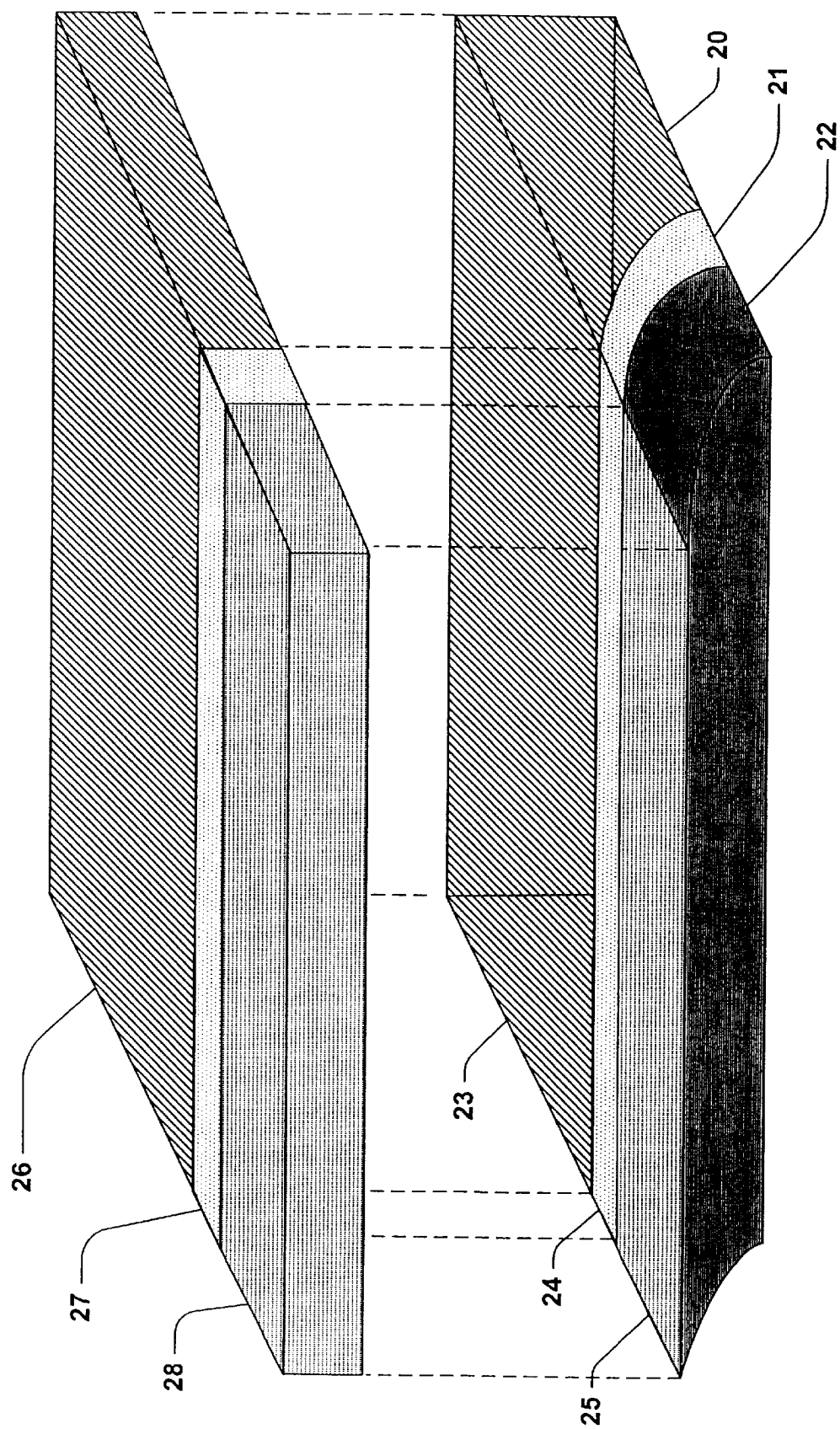
FIG. 6 is a perspective view emphasizing the effects of STI sidewall variation on edge transistor surface areas employed in an array.

FIG. 6 presents an exemplary three dimensional illustration emphasizing the effects of device downscaling on edge transistor surface areas. A shallow trench isolation region, formed in the center portion of a STI array has a shape similar to 20, in which the STI's top portion 23 corresponds to 26 representing an area of the STI region. The surface area of the STI's top portion 23, effectively blocks injection current from entering a portion of a transistor gate of cell adjacent the region 20. However, a STI region formed on an array's edge would include area 21, for example, resulting in STI top portions 23 and 24 corresponding to a surface area 26 and 27. Therefore an STI region on an array edge reduces a surface area of the source/drain regions 25 associated therewith. Since a current drive of a transistor or memory cell is a function of the width/length ratio (W/L) of the device, the variation in shape of STI regions between the center of an STI array and an edge thereof causes corresponding variations in transistor or memory cell behavior across the array, which in many cases is undesirable.

Figure 7:
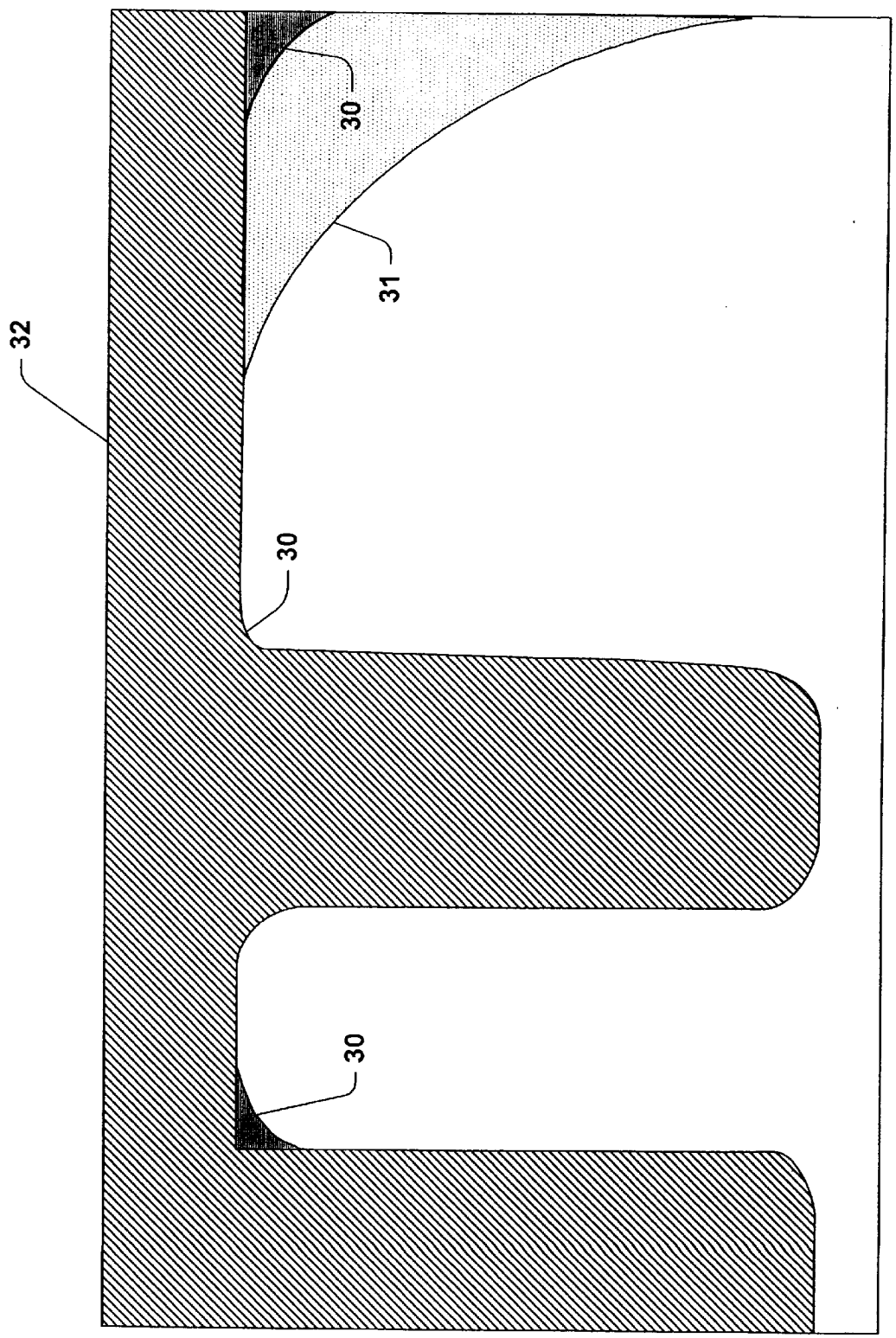
FIG. 7 is a cross sectional view emphasizing an STI region formed on the STI array edge versus an STI formed within center portion of an STI array.

FIG. 7 provides a cross sectional view of an STI region formed on the STI array edge 31 versus an STI formed within center portion of an array 30 (with the differences being amplified or exaggerated for purposes of illustration). Trenches formed within the center of the array are shaped similar to 30. Trenches formed on an array's edge undergo a different formation 31, for example. This formation results in a trench shape similar to 31 and occurs generally on one side of the trench (the side which does not have a trench adjacent to it). After the trench is formed, the array is filled with an insulator material 32 and the STI is complete.

FIGS. 8A and 8B illustrate top and cross sectional views of an STI array, respectively. Because the outer edge STI regions 40 and 41 have a different intrinsic shape 43, memory cells associated therewith will have different electrical characteristics from the center portions of the STI array 42. The intrinsic shape 43 of the STI outer edges 41 causes some injection current variation for transistors or memory cells associated therewith versus devices associated with center STI shapes 42.

Figure 9:
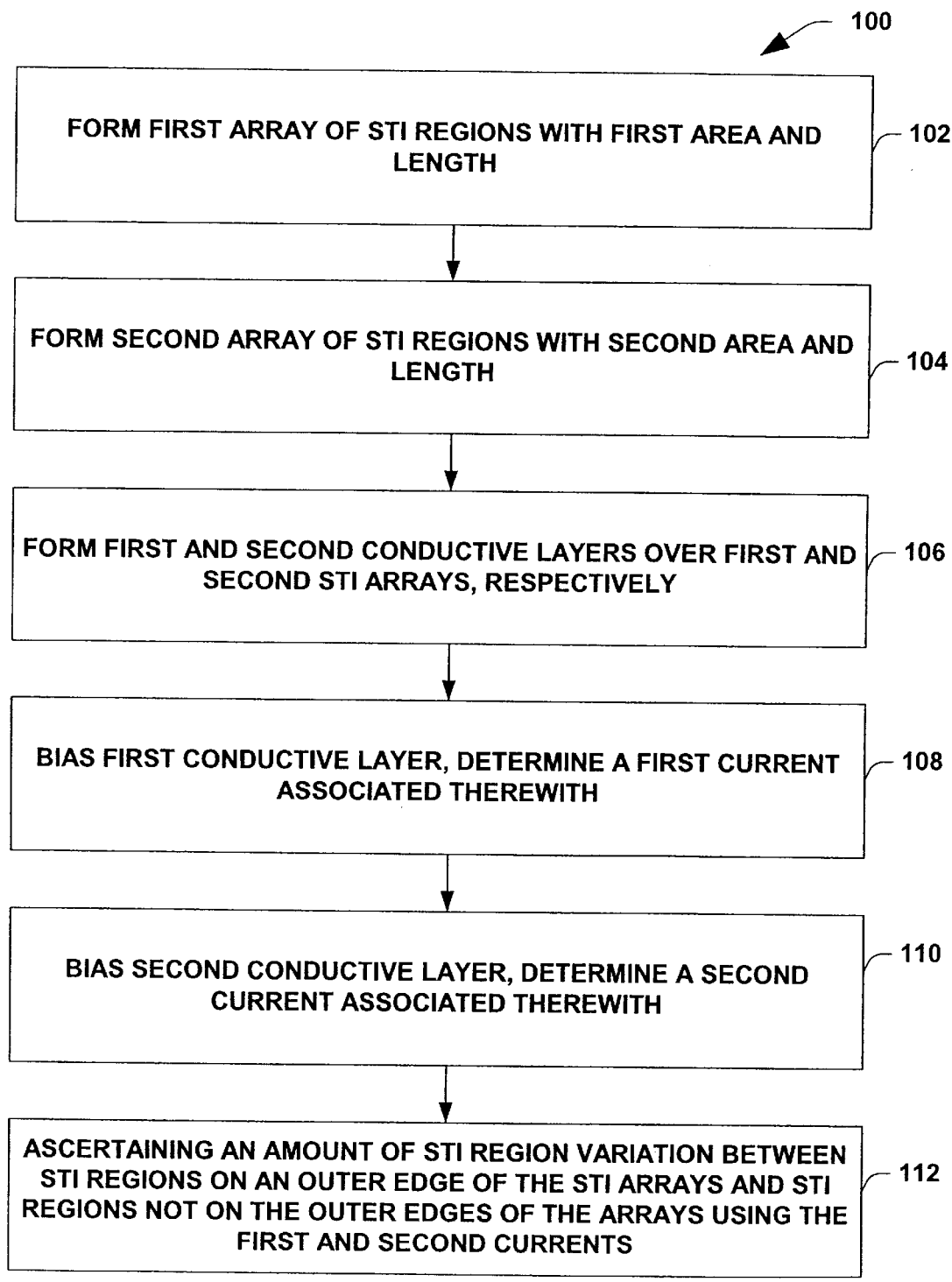
FIG. 9 is a flow chart illustrating a method of characterizing an STI process in accordance with the present invention.

FIG. 9 is a flow chart illustrating a method 100 of characterizing an STI process in accordance with the present invention. As discussed above, an STI process employed in generating an STI array will produce variations between STI regions in the center and on the outer edges of the array. By characterizing an STI process, various processes may be evaluated to determine which type of STI process provides optimal uniformity with respect to the position of an STI region within an STI array. While the exemplary method 100 is illustrated and described herein as a series of acts or events, it will be appreciated that the present invention is not limited by the illustrated ordering of such acts or events, as some acts or events may occur in different orders or concurrently with other acts or events apart from that shown or described herein, in accordance with the invention. In addition, not all illustrated acts or events may be required to implement a methodology in accordance with the present invention. Moreover, it will be appreciated that the method 100 may be implemented in association whit apparatus and systems illustrated and described herein and as well as in association with other systems not illustrated.

Figure 10A:
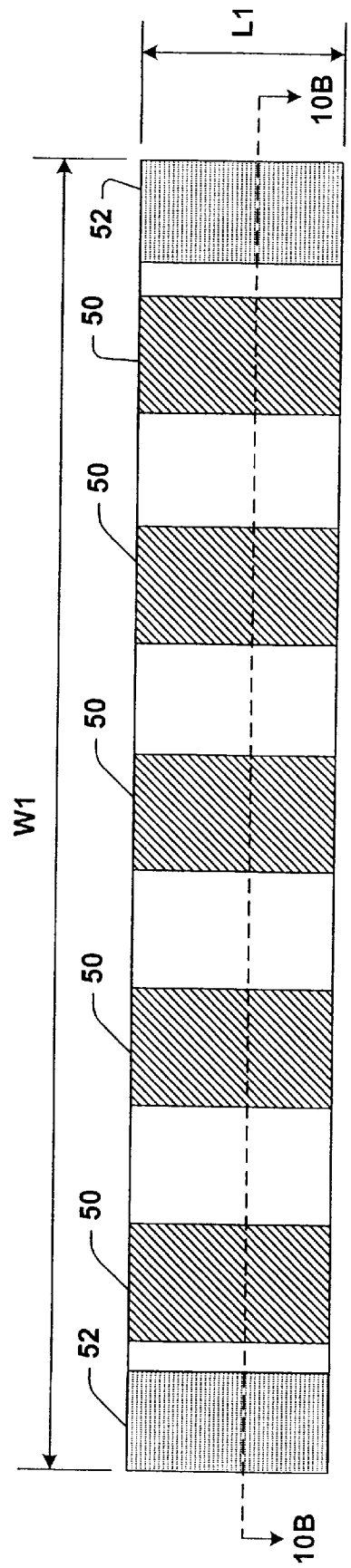
FIGS. 10A & 10B are top and cross sectional views, respectively, for an STI with a first isolation area.
Figure 10B:
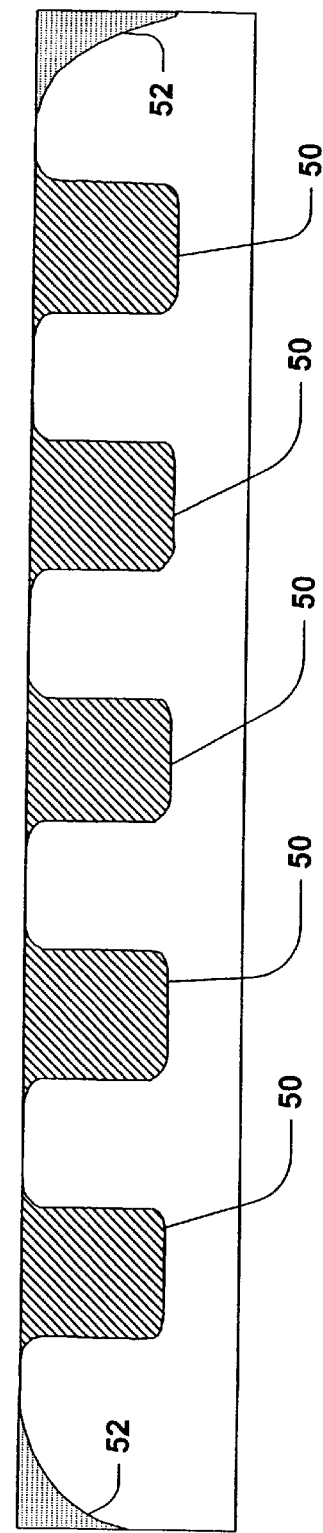
Figure 11A:
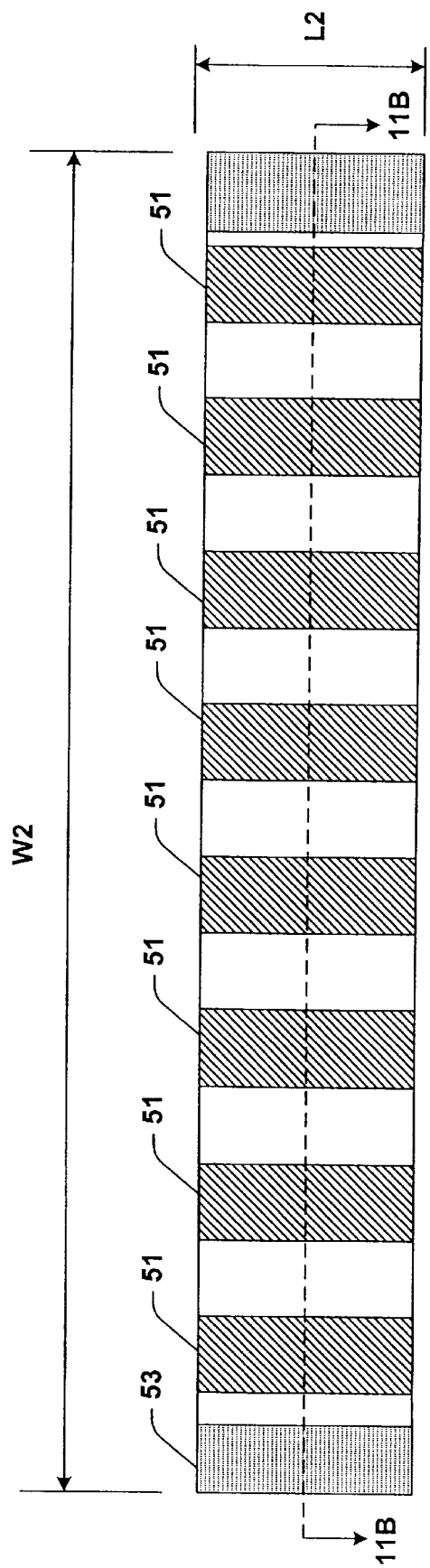
FIGS. 11A & 11B are top and cross sectional views respectively, for an STI with a second differing isolation area.
Figure 11B:
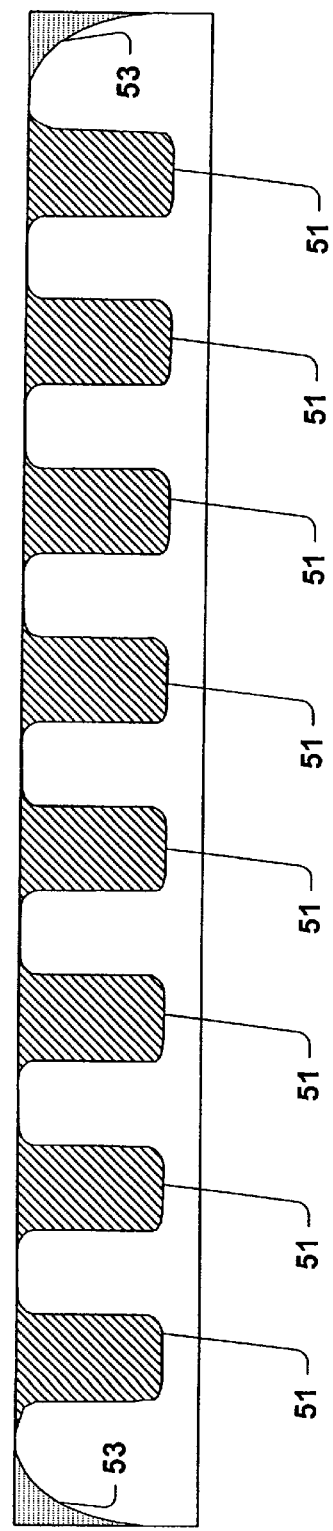

In FIG. 9, the method 100 begins by forming a first array of STI regions at 102, wherein each of the STI regions within the array generally have a first length and the first array has a first area associated therewith. For example, as illustrated in FIGS. 10A and 10B, which represent a top plan view and cross section, respectively, the STI fingers 50 each have a length $L_1$ and array width $W_1$ such that an array area $A_1$ is calculated by $L_1 \times W_1$. Continuing in FIG. 9, a second array of STI regions is formed at 104, with the same STI fabrication that was used to form the first array, wherein the second array has a second length and a second area associated, wherein the first and second lengths are different and the first and second areas are different, respectively. For example, as illustrated in FIGS. 11A and 11B, a second array of STI regions 51 have a second length $L_2$ and a second area $A_2$ calculated by $L_2 \times W_2$, wherein $L_1 \neq L_2$ and $A_1 \neq A_2$.

Figure 12:
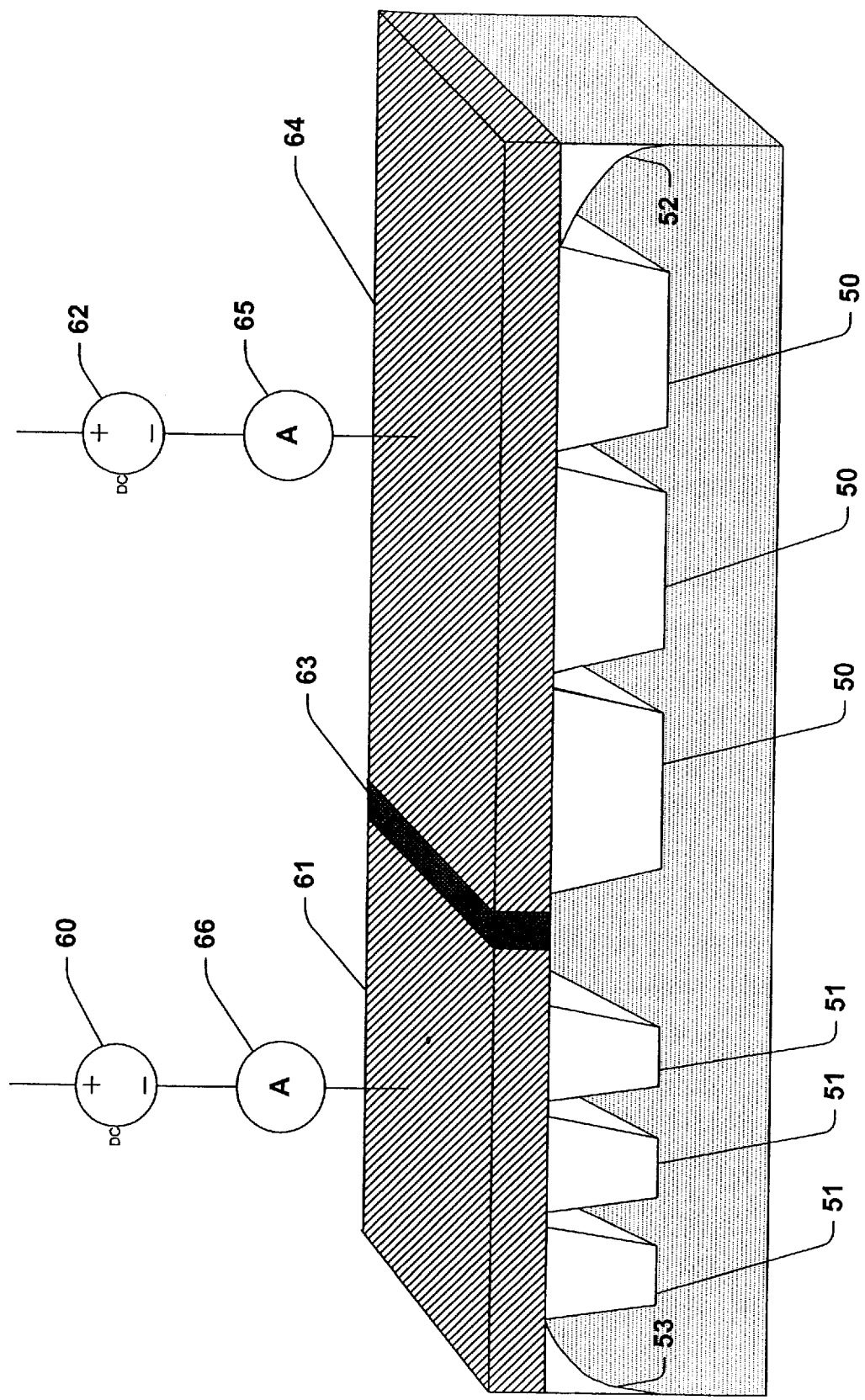
FIG. 12 is a perspective view of two differing STI arrays having a bias applied thereto.

The method 100 continues at 106, wherein first and second conductive layers are formed over the first and second STI arrays, respectively. In one example, as illustrated FIG. 12, if the first and second STI arrays are integrated onto a single substrate, the first and second conductive layers may comprise a single conductive layer such as a metal or polysilicon film separated into two sections 61 and 64 with a space or insulating region 63 disposed therebetween. As illustrated in FIG. 12, the first conductive layer 64 overlies the first STI array of regions 50 while the second conductive layer 61 overlies the second STI array of regions 51.

At 108, the first conductive layer 64 is biased with a voltage 62 and a first current ($I_{g1}$) is determined, for example, using a current meter 65. At 110, the second conductive layer 61 is biased with a voltage 60, and a second current ($I_{g2}$) is determined using, for example, a current meter 66. The method 100 then ascertains an amount of STI region variation between STI regions on an outer edge of an array from STI regions not on the outer edges of arrays (for the STI fabrication process employed to form the first and second arrays) using the first and second currents at 112.

In accordance with one aspect of the present invention, act 112 comprises using the measured currents $I_{g1}$ and $I_{g2}$, to set up two equations with two unknowns. For the first array:

$$I_{g1} = J_n A_1 + J_e L_1,$$

wherein, $J_n$ comprises the current density associated with one finger or region of the first STI array, and $J_e$ represents a current per unit length associated with an outer edge of an STI region of the outer edge of the first array. Similarly, for the second array:

$$I_{g2} = J_n A_2 + J_e L_2.$$

Since $A_1$, $L_1$, $A_2$ and $L_2$ are known and $I_{g1}$ and $I_{g2}$ have been measured, we have two equations with two unknowns ($J_n$ and $J_e$), solving the two equations, $J_n$ and $J_e$ are determined wherein $J_e$ provides information relating to the character of the outer edge of an STI array made by the STI fabrication process being evaluated. By repeating such analysis for additional STI arrays fabricated with different STI fabrication processes, STI fabrication processes can be characterized with respect to the variation in STI regions from outer edges to inside portions of the array.

Although the invention has been shown and described with respect to a certain implementation or implementations, it will be appreciated, by those skilled in the art, that equivalent alterations and modifications will occur, to others skilled in the art, upon the reading and understanding of this specification and the annexed drawings. In particular, regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several implementations or applications of the invention, such features may be combined with one or more other features of the other implementations, as may be desired and advantageous for any given or particular application. Furthermore, to the extent that the term, "includes", "has", "having", and/or variants thereof are used in either the detailed description or the claims, such terms are intended to be inclusive in a manner similar to the terms "comprises" and "comprising".

What is claimed is:

1. A method of characterizing a first shallow trench isolation process, comprising:

forming a first array of isolation regions using the first shallow trench isolation process, wherein each of the isolation regions in the first array have a first length, and wherein the first array has a first area associated therewith;

forming a second array of isolation regions using the first shallow trench isolation process, wherein each of the isolation regions in the second array have a second length, and wherein the second array has a second area associated therewith, and wherein the first area and second areas are different and the first and second lengths are not equal;

forming a first conductive layer over the first array and a second conductive layer over the second array, wherein the first and second conductive layers are electrically isolated from one another;

biasing the first conductive layer and determining a first current associated therewith;

biasing the second conductive layer and determining a second current associated therewith;

evaluating a variation between isolation regions in an interior portion of the first and second arrays and an outer edge of the first and second arrays using the first and second currents.

2. The method of claim 1, wherein evaluating the variation between isolation regions in the interior portion and the outer edge of the arrays comprises using the first and second currents to generate two equations which are solved concurrently to provide a numeric indication reflecting the variation.

3. The method of claim 2, wherein the first array has the first area $A_1$, and the first length is $L_1$, and wherein a first equation of the two equations comprises $$I_{g1} = J_n A_1 + J_e L_1,$$

wherein $I_{g1}$ comprises the first current, $J_n$ comprises a current density associated with an isolation region in an inner portion of an array fabricated by the first shallow trench isolation process, and $J_e$ represents a current per unit length associated with an isolation region on an outer edge of the array.

4. The method of claim 3, wherein the second array has the second area $A_2$, and the second length is $L_2$, and wherein a second equation of the two equations comprises $$I_{g2} = J_n A_2 + J_e L_2,$$

wherein $I_{g2}$ comprises the second current.

5. The method of claim 4, wherein the first and second equations are used to determine $J_n$ and $J_e$.

6. The method of claim 5, further comprising repeating the steps of forming first and second arrays with a second shallow trench isolation process, forming first and second conductive layers thereover, biasing the first and second conductive layers to determine first and second currents, determining $J_n$ and $J_e$ for the second shallow trench isolation process, and evaluating whether the first or second shallow trench isolation is preferred using $J_e$ for the first and second shallow trench isolation processes.

7. The method of claim 1, wherein forming the first and second conductive layers comprises:
   depositing a conductive material; and
   etching a longitudinal space in the conductive material, thereby separating the conductive material into the first and second conductive layers, respectively.

8. The method of claim 1, wherein biasing the first conductive layer comprises coupling a DC potential of a predetermine value thereto and measuring an injection current into a substrate in which the first array resides, wherein the injection current comprises the first current.

9. The method of claim 8, wherein biasing the second conductive layer comprises coupling a DC potential of the predetermined value thereto and measuring an injection current into a substrate in which the second array resides, wherein the current comprises the second current.

10. A method of characterizing a first shallow trench isolation process, comprising:
    forming a first array of isolation regions using the first shallow trench isolation process in a first substrate, wherein each of the isolation regions in the first area have a first length ($L_1$), and wherein the first area has a first area ($A_1$) associated therewith;
    forming a second array of isolation regions using the first shallow trench isolation process in a second substrate, wherein each of the isolation regions in the second array having a second length ($L_2$), wherein the second array has a second area ($A_2$) associated therewith, and wherein $L_1$ does not equal $L_2$ and $A_1$ does not equal $A_2$;
    forming a first conductive layer over the first array;
    forming a second conductive layer over the second array;
    biasing the first conductive layer with a predetermine potential and measuring a first injection current ($I_{g1}$) into the first substrate in response thereto;
    biasing the second conductive layer with the predetermine potential and measuring a second injection current ($I_{g2}$) into the second substrate in response thereto;
    using $I_{g1}$ and $I_{g2}$ to determine a variation between isolation regions in an interior portion of first and second arrays and an outer edge of the first and second arrays.

11. The method of claim 10, wherein using $I_{g1}$ and $I_{g2}$ comprises: forming a first equation, $$I_{g1} = J_n A_1 + J_e L_1,$$

wherein $J_n$ represents a current density associated with an isolation region in an array of isolation regions formed with the first shallow trench isolation process, and $J_e$ is a current per unit length associated with an outer edge isolation region of an array of isolation regions formed with the first shallow trench isolation process;

forming a second equation, $$I_{g2} = J_n A_2 + J_e L_2; \text{ and}$$

solving the first and second equations concurrently to determine $J_n$ and $J_e$.

12. The method of claim 11, further comprising:
    repeating the acts of claims 10 and 11 for a second shallow trench isolation process, thereby determining $J_n$ and $J_e$ for the second shallow trench isolation process; and
    selecting one of the first and second shallow trench isolation process as a preferred process based on $J_e$ of the first and second shallow trench isolation processes, respectively.

* * * * *